United States Patent
Kanal et al.

(10) Patent No.: US 7,126,155 B1
(45) Date of Patent: Oct. 24, 2006

(54) S-PARAMETER POWER PLANE PROBE COUPON

(75) Inventors: Bashu Kanal, Southboro, MA (US); Michael Creighton, Charlton, MA (US)

(73) Assignee: EMC Corporation, Hopkinton, MA (US)

( * ) Notice: Subject to any disclaimer, the term of this patent is extended or adjusted under 35 U.S.C. 154(b) by 65 days.

(21) Appl. No.: 10/975,133

(22) Filed: Oct. 27, 2004

(51) Int. Cl.
*H01L 23/58* (2006.01)

(52) U.S. Cl. .................. 257/48; 257/797; 257/E21.521; 324/158

(58) Field of Classification Search ............... None
See application file for complete search history.

(56) References Cited

U.S. PATENT DOCUMENTS

2005/0063166 A1 * 3/2005 Boggs et al. ............... 361/780

OTHER PUBLICATIONS

Istvan Novak, Frequency-Domain Power-Distribution Measurements—An Overview, Manuscript for DesignCon East 2003, Jun. 2003, Boston, MA, 45 Pages, Sun Microsystems, Inc.

* cited by examiner

*Primary Examiner*—Nathan J. Flynn
*Assistant Examiner*—Scott R. Wilson
(74) *Attorney, Agent, or Firm*—McGuinness & Manaras LLP

(57) ABSTRACT

A test point on a printed circuit board includes at least one connection to the power plane having first and second interconnected pads disposed on opposing sides of the power plane, and at least one connection to the ground plane having third and fourth interconnected pads disposed on opposing sides of the ground plane. The first and second interconnected pads provide parallel paths to the power plane, thereby reducing the impedance presented to test equipment. Similarly, The third and fourth interconnected pads provide parallel paths to the ground plane. The test point may be implemented with multiple ground plane connections disposed symmetrically around a power plane connection. For example, first and second ground plane connections may be disposed on opposing sides of a power plane connection to provide shielding to the power plane connection, thereby reducing the inductive loop associated with probe parasitics.

12 Claims, 3 Drawing Sheets

Test Point Cross-Sectional View

S-PARAMETER POWER PLANE PROBE COUPON

FIELD OF THE INVENTION

This invention is generally related to circuit board analysis, and more particularly to power plane analysis with equipment for measuring impedance.

BACKGROUND OF THE INVENTION

There is a general trend in the field of electronics to produce devices with greater capability and reduced size. Greater performance capability is often associated with increases in processing power and clock frequencies. Electronic components are now capable of signal edge rates which exceed the capability of printed circuit boards. For example, increases in power plane impedance at particular frequencies may result in voltage drops which adversely effect voltage to the power supply of an integrated circuit chip. This problem is exacerbated by the reduction of the physical size of components and printed circuit boards which causes significant power consumption at discrete points of the power plane. It is common practice to test a printed circuit board design during development in order to identify limitations at the switching frequencies of integrated circuit chips in relation to their position on the printed circuit board and the impedance characteristics of the power plane. However, the levels of impedance capable of causing problems can now be so small that a standard 50Ω test probe is inadequate for testing purposes.

SUMMARY OF THE INVENTION

In accordance with the invention a test point includes at least one connection to the power plane having first and second interconnected pads disposed on opposing sides of the power plane, and at least one connection to the ground plane having third and fourth interconnected pads disposed on opposing sides of the ground plane. The first and second interconnected pads provide parallel paths to the power plane, thereby reducing the impedance presented to test equipment. Similarly, The third and fourth interconnected pads provide parallel paths to the ground plane, thereby reducing the impedance presented to the test equipment. The pads may be disposed on opposing surfaces of the printed circuit board to facilitate access.

One advantage of the invention is reduction of the undesirable impedance contributions of the vias associated with test points. This undesirable impedance is reduced by placing the ports of the measurement instrument in parallel along the parallel paths formed by the interconnected pads. For example, the series elements of the measurement instrument are provided with a 25Ω environment, rather than 50Ω. As a result, more accurate measurements, such as milliohm range impedance values, are enabled.

The test point may be implemented with multiple ground plane connections disposed symmetrically around the power plane connection. For example, first and second ground plane connections may be disposed on opposing sides of a power plane connection. One advantage of this implementation is that the ground connections provide shielding to the power plane connection. Consequently, the inductive loop associated with probe parasitics may be reduced.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

Figure 1:
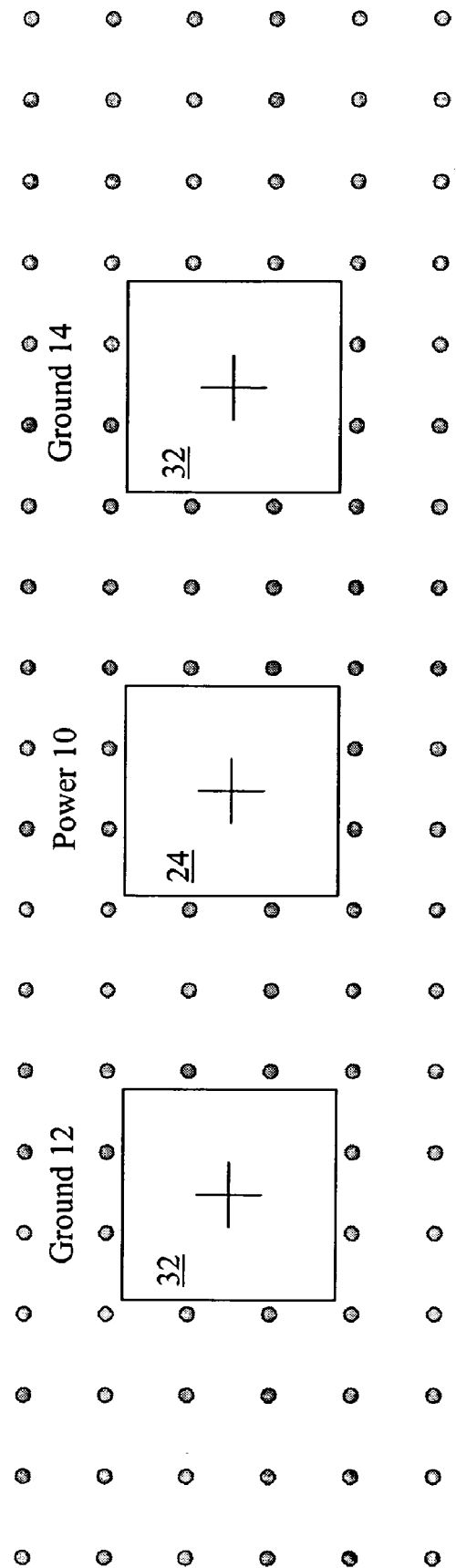
FIG. 1 is a top view of a printed circuit board test point.
Figure 2:
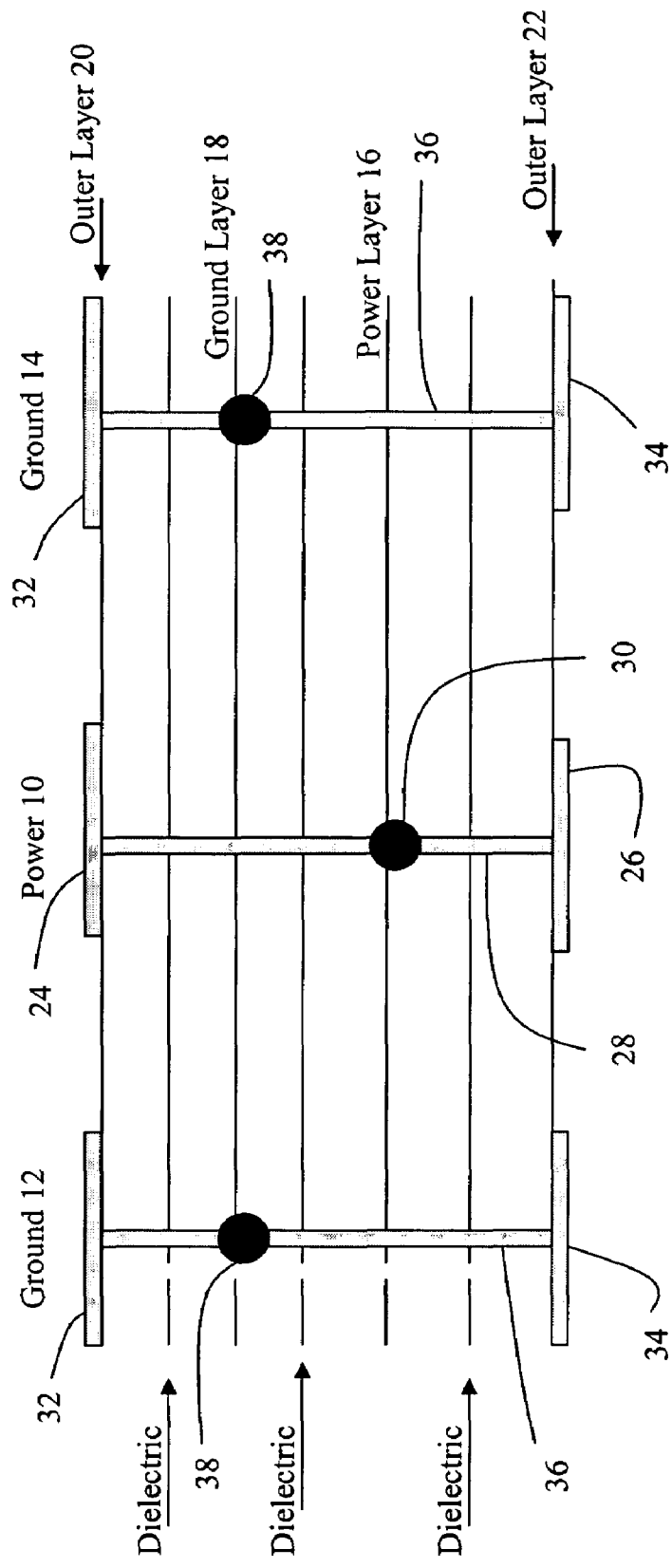
FIG. 2 is a cross-sectional view of the test point of FIG. 1.

Referring to FIGS. 1 and 2, a printed circuit board test point ("coupon") includes a power connection 10 and two ground connections 12, 14. In the illustrated example, the printed circuit board includes multiple inner layers, including a power layer 16 ("plane") and ground layer 18 ("plane"), disposed between outer layers, 20, 22.

The power connection 10 includes a conductive pad 24 disposed on the top outer layer 20 and another conductive pad 26 disposed on the bottom outer layer 22. The conductive pads are interconnected by a conductor 28 such as a wire or via. The conductor 28 is approximately perpendicular with the pads 24, 26, and connected at the centers of the pads. Further, the conductor is connected with the power layer 16 at connection point 30. As such, the conductor and conductive pads provide parallel electrical pathways between the power layer and the outer layers of the printed circuit board.

The ground connections 12, 14 have an architecture similar to the power connection. Each ground connection includes a conductive pad 32 disposed on the top outer layer 20 and another conductive pad 34 disposed on the bottom outer layer 22. The conductive pads 32, 34 are interconnected by a conductor 36 such as a wire or via. Further, the conductor 36 is connected with the ground layer at connection point 38. As such, the conductor and conductive pads provide parallel electrical pathways between the ground layer and the outer layers of the printed circuit board.

The parallel pathways to the power and ground layers reduce the undesirable impedance contributions of the conductors associated with the pads. The abrupt change in direction, e.g., 90 degrees, of electrical flow between a printed circuit board layer and a via is one contributor to the undesirable impedance. The cylindrical cross-sectional shape of the via also tends to contribute to the impedance. By placing the ports of the measurement instrument in contact with and associated pair of pads the measurement instrument measures along parallel paths, thereby reducing the undesirable impedance. For example, the series elements of the measurement instrument may connected with a 25Ω environment, rather than 50Ω. As a result, accurate measurements of milliohm impedance values is possible.

The test point may be implemented with more than two ground plane connections disposed around the power plane connection. In the illustrated example first and second ground plane connections 12, 14 are disposed on opposing sides of the power plane connection 10. However, three or more ground plane connections could be disposed equidistantly and symmetrically around the power plane connection. Although the precise dimensions implemented may vary, in the illustrated example the pads are disposed at 1270 micron centers, with an edge to edge separation of 457 microns. Other dimensions which may be implemented include but are not limited to 120 mils center-to-center with 50 mil edge-to-edge separation, and 38 mils center-to-center with 6 mil edge-to-edge separation. Whatever dimensions are implemented, there may be some advantage to use of a single center-to-center dimension and a single edge-to-edge separation for each ground layer connection relative to the power layer connection such that the ground layer connections form a symmetrical geometric pattern relative to the power layer connection. Implementing multiple ground connections around a power connection advantageously provides shielding to the power plane connection. Although the grounded conductors may not entirely surround the power connection, the non-continuous shielding provided by the ground connections mitigates the effects of the inductive loop associated with probe parasitics.

Figure 3:
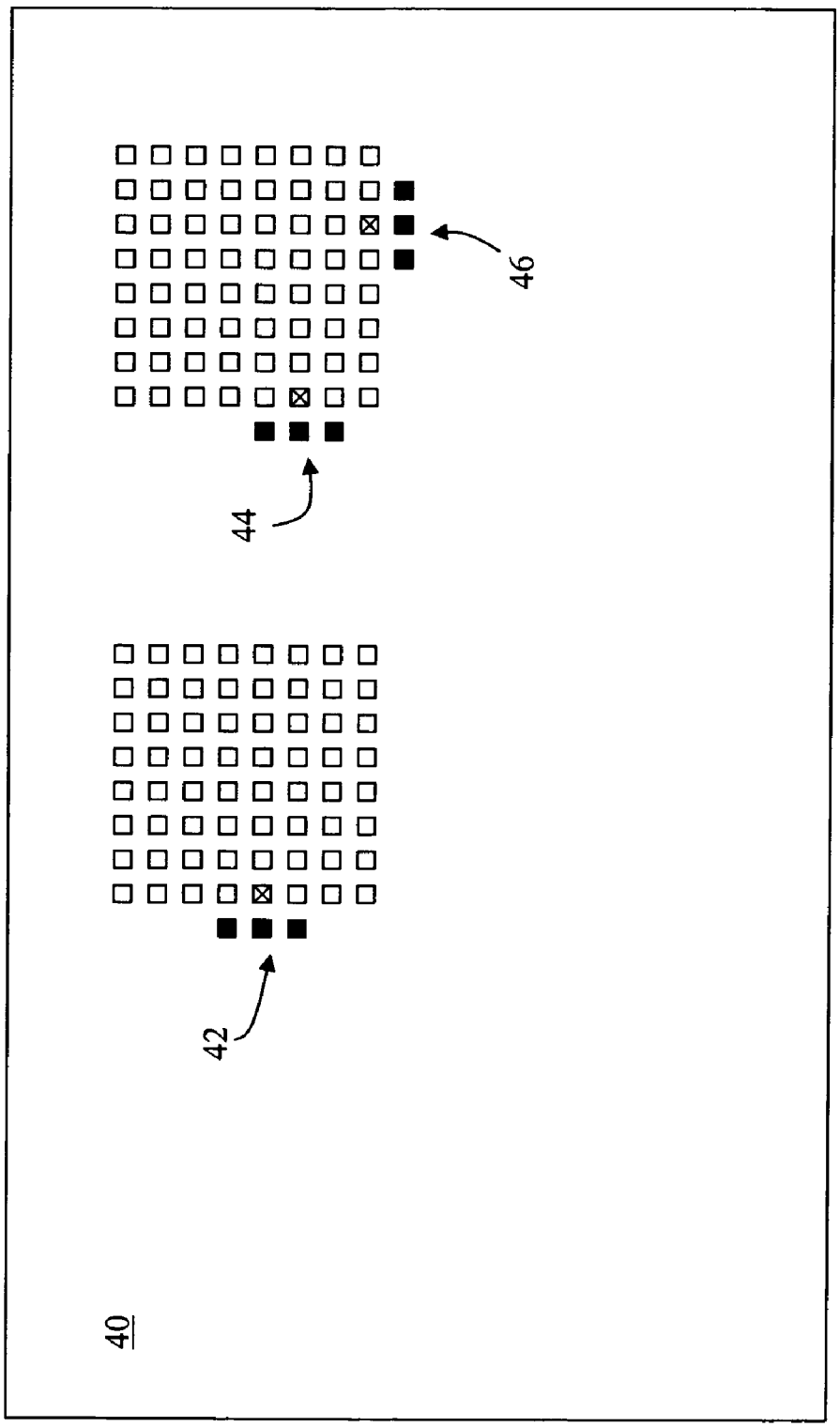
FIG. 3 is a top view of a printed circuit board including test points located near areas of relatively high power consumption.

Referring now to FIG. 3, test points may be located proximate to areas of greater power consumption on a printed circuit board 40. The power consumption characteristics of components is often provided by designers and manufacturers in specification sheets. Further, power consumption modeling software is known in the art. These resources may be used, either alone or in combination, to help determine where to locate test points. In the illustrated example test points 42, 44, 46 are located proximate to power contacts of ball grid array ("BGA") chips. Depending on the number and location of power contacts, it may be desirable to implement multiple test points, such as test points 44, 46, proximate to a single component. Further, the conductors associated with the test points may be implemented with the same geometry as the nearby power contact that is being studied.

In view of the description above, it will be understood by those of ordinary skill in the art that modifications and variations of the described and illustrated embodiments may be made within the scope of the inventive concepts. Moreover, while the invention is described in connection with various illustrative structures, those of ordinary skill in the art will recognize that the invention may be employed with other structures. Accordingly, the invention should not be viewed as limited except by the scope and spirit of the appended claims.

What is claimed is:

1. A test point for a printed circuit board having first and second outer layers, and a power layer and a ground layer disposed between the first and second outer layers, comprising:
   a first conductive pad disposed on the first outer layer;
   a second conductive pad disposed on the second outer layer;
   a first conductor connected with both the first pad and the second pad, the first conductor also being connected to the power layer such that electrical properties of the power layer are measurable at the first and second pads; and
   at least one connection to the ground layer, each ground layer connection including:
      a third conductive pad disposed on the first outer layer;
      a fourth conductive pad disposed on the second outer layer; and
      a second conductor connected with both the third pad and the fourth pad, the second conductor also being connected to the ground layer.

2. The test point of claim 1 wherein the first conductor is perpendicular to both the first and second pads, and connected to the first and second pads at center points thereof.

3. The test point of claim 1 wherein the first and second pads have substantially equal physical dimensions.

4. The test point of claim 1 wherein a plurality of ground layer connections are disposed symmetrically about the first conductor.

5. The test point of claim 4 wherein the test point is located proximate to a position of relatively high power consumption.

6. The test point of claim 5 wherein the test point is located proximate to a power connection of a component.

7. A method of providing a test point for a printed circuit board having first and second outer layers, and a power layer and a ground layer disposed between the first and second outer layers, comprising the steps of:
   forming a first conductor connected to the power layer and extending to both the first and second outer layers;
   forming a first conductive pad on the first outer layer such that the first conductive pad is connected to the first conductor;
   forming a second conductive pad on the second outer layer such that the second conductive pad is connected to the first conductor; and
   providing at least one connection to the ground layer by:
      forming a second conductor connected to the ground layer and extending to both the first and second outer layers;
      forming a third conductive pad on the first outer layer such that the first conductive pad is connected to the second conductor; and
      forming a fourth conductive pad on the second outer layer such that the second conductive pad is connected to the second conductor.

8. The method of claim 7 wherein the first conductor is perpendicular to both the first and second pads, and connected to the first and second pads at center points thereof.

9. The method of claim 7 wherein the first and second pads have substantially equal physical dimensions.

10. The method of claim 7 wherein a plurality of ground layer connections are disposed symmetrically about the first conductor.

11. The method of claim 10 wherein the test point is located proximate to a position of relatively high power consumption.

12. The method of claim 11 wherein the test point is located proximate to a power connection of a component.

* * * * *